(12) United States Patent
Hwang et al.

(10) Patent No.: US 9,515,091 B2
(45) Date of Patent: Dec. 6, 2016

(54) THIN FILM TRANSISTOR ARRAY PANEL INCLUDING ANGLED DRAIN REGIONS

(71) Applicant: Samsung Display Co., Ltd., Yongin, Gyeonggi-Do (KR)

(72) Inventors: Jung Hwan Hwang, Cheonan-si (KR); Bon-Yong Koo, Cheonan-si (KR); Soo Jin Park, Seoul (KR); Jong-Moon Park, Suwon-si (KR); Yong Hee Lee, Daejeon (KR); Jong-Hyuk Lee, Seoul (KR); Duc-Han Cho, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 110 days.

(21) Appl. No.: 14/099,977

(22) Filed: Dec. 8, 2013

(65) Prior Publication Data

US 2014/0191238 A1    Jul. 10, 2014

(30) Foreign Application Priority Data

Jan. 4, 2013   (KR) ..................... 10-2013-0001088

(51) Int. Cl.
*H01L 29/04*    (2006.01)
*H01L 27/12*    (2006.01)
(Continued)

(52) U.S. Cl.
CPC ......... *H01L 27/1214* (2013.01); *H01L 27/124* (2013.01); *H01L 27/156* (2013.01); *H01L 29/41733* (2013.01)

(58) Field of Classification Search
CPC ........................ H01L 27/156; H01L 27/1214
(Continued)

(56) References Cited

U.S. PATENT DOCUMENTS 5,546,205 A    8/1996   Sukegawa et al.
7,041,521 B2   5/2006   Song et al.
(Continued)

FOREIGN PATENT DOCUMENTS

CN    101359692 A    2/2009
CN    102544110 A    7/2012
(Continued)

OTHER PUBLICATIONS

The Extended European Search Report for European Patent Application No. 14150176.7 dated Apr. 29, 2014.

*Primary Examiner* — Matthew Gordon
(74) *Attorney, Agent, or Firm* — Cantor Colburn LLP

(57) ABSTRACT

A thin film transistor array panel includes a gate line elongated in an extension direction and including a gate and dummy gate electrode extended therefrom; and a source electrode, and a single drain member including a drain electrode at a first end thereof and a dummy drain electrode at an opposing second end thereof. The drain electrode faces the source electrode with respect to the gate electrode, and the dummy drain electrode overlaps the dummy gate electrode. The drain and dummy drain electrode respectively include a plurality of first and second regions each having a predetermined width in the extension direction. A second region includes an edge which forms an angle from about 0 degrees to about 90 degrees with the extension direction, and a planar area of at least one of the plurality of second regions is different from that of remaining second regions.

20 Claims, 14 Drawing Sheets

(51) Int. Cl.
*H01L 29/417* (2006.01)
*H01L 27/15* (2006.01)

(58) Field of Classification Search
USPC .................................................. 257/59, 72
See application file for complete search history.

(56) References Cited

U.S. PATENT DOCUMENTS

| | | |
|---|---|---|
| 7,687,835 B2 | 3/2010 | Kwak et al. |
| 8,179,511 B2 | 5/2012 | Kang et al. |
| 2005/0146645 A1 | 7/2005 | Lai |
| 2009/0026451 A1 | 1/2009 | Shin et al. |
| 2011/0089422 A1* | 4/2011 | Yoon et al. ..................... 257/59 |
| 2011/0095294 A1 | 4/2011 | Lee et al. |
| 2011/0133194 A1 | 6/2011 | Liu et al. |

FOREIGN PATENT DOCUMENTS

| | | |
|---|---|---|
| JP | 2002-203970 A | 7/2002 |
| JP | 2007-011056 A | 1/2007 |
| KR | 1020040023276 A | 3/2004 |
| KR | 100511172 B1 | 8/2005 |
| KR | 1020060028970 A | 4/2006 |
| KR | 1020070006222 A | 1/2007 |
| KR | 1020070102125 A | 10/2007 |
| KR | 1020080050704 A | 6/2008 |
| KR | 1020100075023 A | 7/2010 |
| KR | 1020130092321 A | 8/2013 |

\* cited by examiner

THIN FILM TRANSISTOR ARRAY PANEL INCLUDING ANGLED DRAIN REGIONS

This application claims priority to Korean Patent Application No. 10-2013-0001088 filed on Jan. 4, 2013, and all the benefits accruing therefrom under 35 U.S.C. §119, the entire contents of which are incorporated herein by reference.

BACKGROUND (a) Field

The invention relates to a thin film transistor array panel.

(b) Description of the Related Art

Liquid crystal displays ("LCDs") are one of the most widely used flat panel displays. LCDs display images by applying voltages to field generating electrodes to generate an electric field in an LC layer that determines orientations of LC molecules therein to adjust polarization of incident light.

In general, the LCD includes a display panel which includes two substrates each including a field generating electrode and a liquid crystal layer interposed therebetween, and pixels or pixel areas are defined thereon. A pixel electrode among the field generating electrodes is arranged in a matrix on a substrate and is connected to a switching element such as a thin film transistor ("TFT"), thereby sequentially receiving a data voltage for one row of pixels or pixel areas.

SUMMARY

One or more exemplary embodiment of the invention reduces or effectively prevents deterioration of display quality in a display panel by uniformly maintaining parasitic capacitance between a gate electrode and a drain electrode.

An exemplary embodiment of a thin film transistor array panel according to the invention includes: a substrate; a gate line elongated in a first direction and comprising a first gate electrode and a second gate electrode and disposed on the substrate; a gate insulating layer on the first gate electrode and the second gate electrode; a semiconductor on the gate insulating layer; and a source electrode and a first drain electrode and a second drain electrode connected to each other disposed on the semiconductor. The first drain electrode faces the source electrode with respect to the first gate electrode, and the second drain electrode is disposed adjacent to the second gate electrode, the drain electrode comprises a plurality of first regions each having a predetermined width in the first direction, and the second drain electrode comprises a plurality of second regions each having a predetermined width in the first direction, at least one of the plurality of second regions comprises an edge which forms an angle from about 0 degrees to about 90 degrees with the first direction, and a planar area of at least one of the plurality of second regions is different from each planar area of remaining second regions of the plurality of second regions.

A first region of the plurality of first regions of the drain electrode may include an edge forming an angle from about 0 degrees to about 90 degrees with the first direction, and a planar area of at least one of the plurality of first regions may be different from each planar area of remaining first regions of the plurality of first regions.

Planar areas of the plurality of first regions and planar areas of the plurality of second regions may one of increase and decrease in the first direction away from the source electrode.

The plurality of first regions may include a first sub-region, a second sub-region and a third sub-region disposed in sequence in the first direction away from the source electrode, and the plurality of second regions may include a fourth sub-region, a fifth sub-region and a sixth sub-region disposed in sequence in the first direction towards the source electrode. The planar area of the first sub-region may be the same as the planar area of the sixth sub-region, the planar area of the second sub-region may be the same as the planar area of the fifth sub-region, and the planar area of the third sub-region may be the same as the planar area of the fourth sub-region.

The thin film transistor array panel may further include a passivation layer on the source electrode, the first drain electrode and the second drain electrode, and a pixel electrode positioned on the passivation layer and connected to the drain electrode through a contact hole defined in the passivation layer.

The thin film transistor array panel may further include a common electrode overlapping the pixel electrode, and an insulating layer between the common electrode and the pixel electrode.

One of the pixel electrode and the common electrode may include a plurality of branch electrodes, and the other may have a plane shape of a plate type.

Another exemplary embodiment of a thin film transistor array panel according to the invention includes: a substrate; a gate line elongated in a first direction, and comprising a first gate electrode and a second gate electrode extended therefrom, on the substrate; a gate insulating layer on the first gate electrode and the second gate electrode; a semiconductor on the gate insulating layer; and a source electrode and a first drain electrode and a drain electrode connected to each other disposed on the semiconductor. The first drain electrode faces the source electrode with respect to the first gate electrode, and the second drain electrode is disposed adjacent to the second gate electrode, the first drain electrode comprises a plurality of first regions each having a predetermined width in the first direction, and the second drain electrode comprises a plurality of third regions each having a predetermined width in the first direction, and a planar area of at least one of the plurality of third regions of the second drain electrode is different from each planar area of remaining third regions of the plurality of third regions.

Planar areas of the plurality of first regions and planar areas of the plurality of third regions may one of increase and decrease in the first direction away from the source electrode.

One or more exemplary embodiment of a thin film transistor array panel according to the invention includes the dummy gate electrode and the dummy drain electrode. A shape of a drain electrode and the dummy drain electrode are designed such that a change in total planar area overlapping an underlying gate electrode and dummy gate electrode is uniform when the gate and gate dummy electrode shift. Alternatively, the dummy drain electrode and the dummy gate electrode are designed such that a change in planar overlapping area is uniform when the gate and dummy gate electrode shifts. Although the shape of the drain electrode may be changed, the overlapping area between a gate electrode and the dummy gate electrode, and the drain electrode and the dummy drain electrode, respectively, may be uniformly maintained. Accordingly, the parasitic capacitance is uniformly maintained, thereby reducing or effectively preventing the display quality deterioration of a liquid crystal display employing the thin film transistor array panel according to the parasitic capacitance difference.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
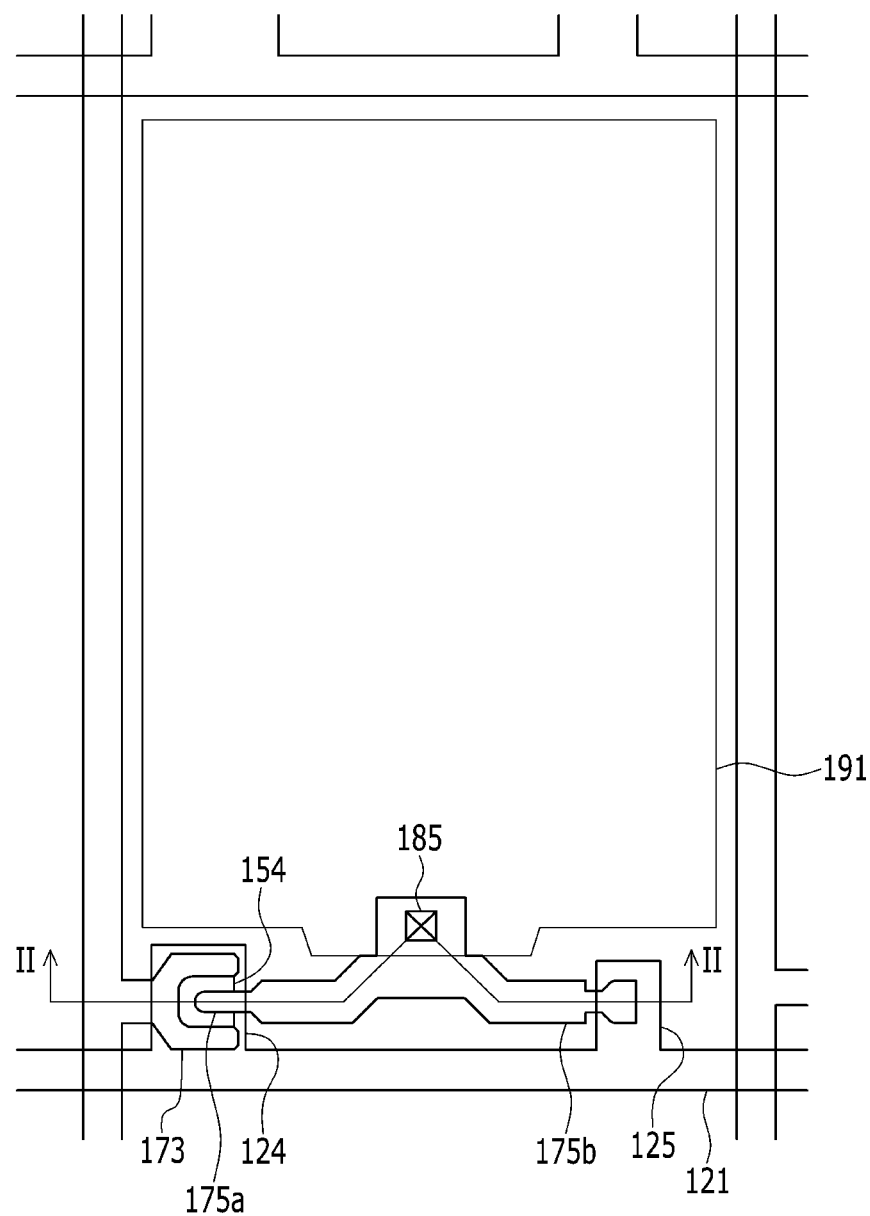
FIG. 1 is a plan view of an exemplary embodiment of a thin film transistor array panel according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "over," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features.

Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When manufacturing a display panel of a liquid crystal display including the switching element such as a thin film transistor ("TFT"), photolithography processes are used. In a process of forming a gate wire and a process of forming a data wire of the display panel, positions of the gate wire and the data wire may be changed for each region in the display panel because of an error of an exposure process. Changing of such positions may result in an overlapping area of the gate wire and the data wire being different depending on a position difference of the two wires. As described above, if the overlapping area between a gate electrode and a source/drain electrode of the TFT is different, a difference in parasitic capacitance is undesirably generated and causes a deterioration of display quality such as a stitch defect or a flicker. Hereinafter, the invention will be described in detail with reference to the accompanying drawings.

Now, exemplary embodiments of a TFT array panel according to the invention will be described with reference to accompanying drawings.

Figure 2:
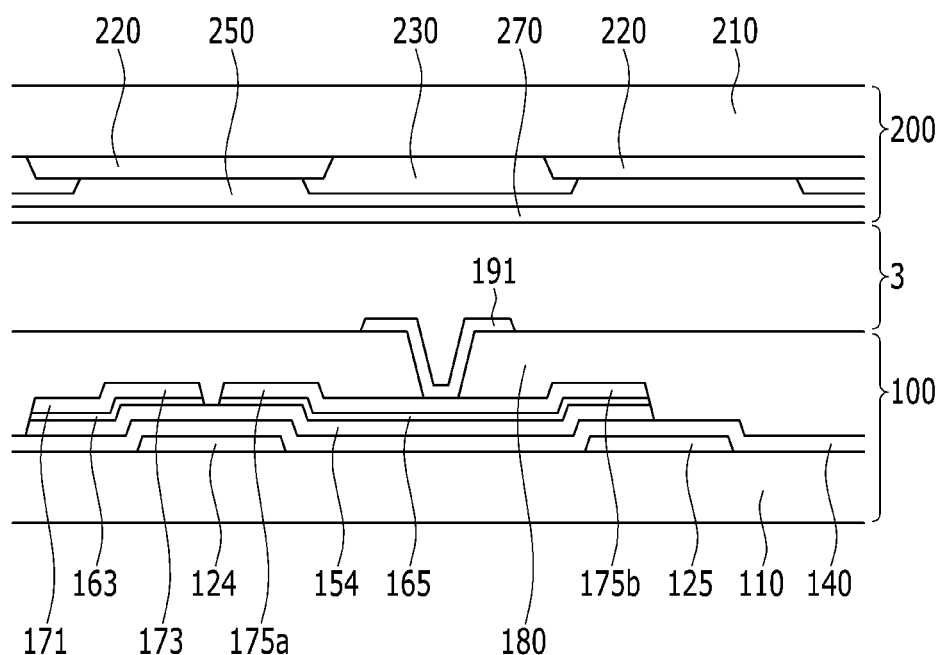
FIG. 2 is a cross-sectional view of the thin film transistor array panel of FIG. 1 taken along line II-II.
Figure 3:
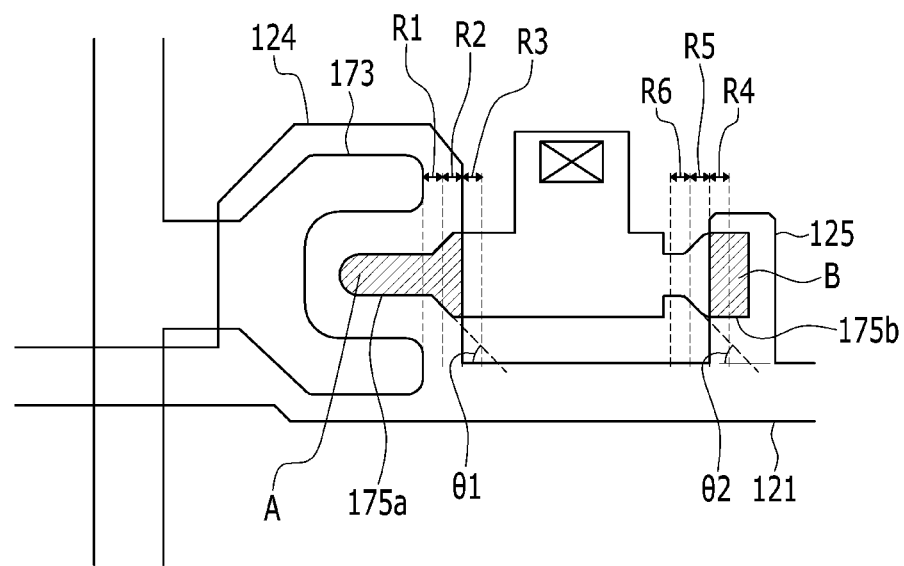
FIG. 3 is a plan view of an exemplary embodiment of an enlarged portion of the thin film transistor array panel of FIG. 1.

Firstly, an exemplary embodiment of a TFT array panel 100 according to the invention will be described with reference to FIG. 1 to FIG. 3. FIG. 1 is a plan view of an exemplary embodiment of a TFT array panel according to the invention, FIG. 2 is a cross-sectional view of the TFT array panel of FIG. 1 taken along line II-II, and FIG. 3 is a plan view of an exemplary embodiment of an enlarged portion of the TFT array panel of FIG. 1.

One or more gate line 121 is disposed on a lower insulation substrate 110. The lower insulation substrate 110 may include transparent glass or plastic.

The gate line 121 transmits one or more gate signals and is elongated to extend in a transverse direction. Each gate line 121 includes a plurality of gate electrodes 124 and a plurality of dummy gate electrodes 125 extended therefrom. Although not shown, each gate line 121 includes a gate pad portion having a relatively large planar area for contact with another layer of the TFT array panel 100 and/or an external driving circuit. A gate driving circuit (not shown) that generates a gate signal may be mounted on a flexible printed circuit film (not shown) that is attached to the lower insulation substrate 110, directly mounted on the lower insulation substrate 110 or integrated with the lower insulation substrate 110. When the gate driving circuit is integrated with the lower insulation substrate 110, the gate line 121 may be extended to directly connect to the circuit.

Although it is not illustrated, a storage electrode line disposed on and/or in a same layer of the TFT array panel 100 as the gate line 121 may be further included.

The gate line 121 may include aluminum metals such as aluminum (Al) or an aluminum alloy, silver metals such as silver (Ag) or a silver alloy, copper metals such as copper (Cu) or a copper alloy, molybdenum metals such as molybdenum (Mo) or a molybdenum alloy, chromium (Cr), thallium (Ta), titanium (Ti), and so on. However, the gate line 121 may have a multi-layered structure including two conductive layers (not shown) that have different physical properties, and the multiple layers may include various metals or conductors.

A gate insulating layer 140 including silicon nitride (SiNx), silicon oxide (SiOx), or so on is disposed on the gate line 121.

One or more semiconductor 154 is disposed on the gate insulating layer 140. The semiconductor 154 may include hydrogenated amorphous silicon (simply referred to as a-Si), polysilicon, or an oxide semiconductor.

One or more ohmic contacts 163 and 165 is disposed on the semiconductor 154. The ohmic contacts 163 and 165 may include n+ hydrogenated a-Si heavily doped with an N-type impurity such as phosphorous, or may include a silicide. The ohmic contacts 163 and 165 form a pair of ohmic contacts on the semiconductor 154.

One or more data line 171, one or more drain electrode 175a and/or one or more dummy drain electrode 175b is disposed on the ohmic contacts 163 and 165.

The data line 171 transmits a data voltage and is elongated to extend in a longitudinal direction, thereby intersecting the gate lines 121. Each data line 171 of a plurality of data lines 171 includes a plurality of source electrodes 173 extending therefrom and toward the gate electrodes 124 and a data pad (not shown) with a relatively wide planar area for connection with a different layer of the TFT array panel 100 and/or an external driving circuit. A data driving circuit (not shown) for generating a data signal can be mounted on a flexible printed circuit film (not shown) attached on the lower insulation substrate 110, mounted directly on the lower insulation substrate 110, or integrated on the lower insulation substrate 110. Where the data driving circuit is integrated on the lower insulation substrate 110, the plurality of data lines 171 may be elongated to be connected therewith.

The drain electrode 175a is separated from the data line 171 in the plan view, and faces the source electrodes 173 with respect to the gate electrode 124. A portion of the semiconductor 154 is exposed between the spaced apart drain electrode 175a and source electrode 173.

The drain electrode 175a and a dummy drain electrode 175b are continuous with and connected to each other, where the dummy drain electrode 175b is positioned to be relatively close to the dummy gate electrode 125.

One gate electrode 124, one source electrode 173 and one drain electrode 175a constitute a TFT together with the semiconductor 154, and a channel of the TFT is formed at the exposed semiconductor 154 between the source electrode 173 and the drain electrode 175a.

The data line 171, the drain electrode 175a and the dummy drain electrode 175b may include a refractory metal, such as molybdenum, chromium, tantalum and titanium, or alloys thereof. The data line 171, the drain electrode 175a and the dummy drain electrode 175b may have a multi-layer structure including a refractory metal film first layer (not shown) and a low-resistance conductive second layer (not shown). Also, the data line 171 and the drain electrode 175a may include various other metals or conductors.

The ohmic contacts 163 and 165 exist only between the underlying semiconductor 154 and the overlying data lines 171, drain electrodes 175a and dummy drain electrode 175b to lower contact resistance between the underlying and overlying elements. However, when the semiconductor 154 includes an oxide semiconductor, the ohmic contacts 163 and 165 may be omitted.

A passivation layer 180 is disposed on the data line 171, the drain electrode 175a, the dummy drain electrode 175b and the exposed portion of the semiconductor 154.

The passivation layer 180 may include an inorganic insulator or an organic insulator, and may have a substantially flat surface to provide a planar surface of the TFT array panel 100. The inorganic insulator may include, but is not limited to, silicon nitride or silicon oxide. The organic insulator may have a dielectric constant of less than about 4.0, and photosensitivity. Also, the passivation layer 180 may have a dual-layered structure of a lower inorganic layer and an upper organic layer such that harm to the exposed portion of the semiconductor 154 may be reduced or effectively prevented, while still sustaining the excellent insulation characteristics of the organic layer.

One or more contact hole 185 may be defined in the passivation layer 180 and expose an expansion of the drain electrode 175a.

One or more pixel electrode 191 is disposed on the passivation layer 180. The pixel electrode 191 may include a transparent conductive material such as indium tin oxide ("ITO") or indium zinc oxide ("IZO"), or a reflective metal such as aluminum, silver, chromium or alloys thereof.

The pixel electrode 191 is physically and electrically connected to the drain electrode 175a through the contact hole 185, and is applied with the data voltage from the drain electrode 175a. The pixel electrode 191 supplied with the data voltage generates an electric field along with a common electrode 270 of a common electrode panel 200. The electric field determines the orientations of liquid crystal molecules of a liquid crystal layer 3 disposed between the electrodes 191 and 270. Accordingly, the polarization of the light transmitted through the liquid crystal layer 3 differs depending on the determined orientation of the liquid crystal molecules.

The common electrode panel 200 will now be described.

The common electrode panel 200 includes one or more light blocking member 220 disposed on an upper insulation substrate 210, one or more color filter 230 positioned in regions defined by adjacent light blocking members 220, an overcoat 250 positioned on the light blocking members 220 and the color filter 230, and the common electrode 270 positioned on the overcoat 250. In an alternative exemplary embodiment, the overcoat 250 may be omitted.

Next, referring to FIG. 3, the gate electrode 124, the dummy gate electrode 125, the drain electrode 175a and the dummy drain electrode 175b of the TFT array panel 100 according to the invention.

Referring to FIG. 3, the drain electrode 175a and the dummy drain electrode 175b are continuous with and connected to each other to form a single, unitary, indivisible member, such as a drain member. The drain electrode 175a at a first end of the drain member faces the source electrode 173 with respect to the gate electrode 124. The dummy drain electrode 175b at an opposing second end of the drain member is positioned at a side opposite to the drain electrode 175a and is positioned to be close to the dummy gate electrode 125.

The drain electrode 175a includes a plurality of sub-regions R1, R2 and R3 having a predetermined width with reference to a direction in which the gate line 121 is elongated to extend. The dummy drain electrode 175b also includes a plurality of sub-regions R4, R5 and R6 having a predetermined width with reference to the direction in which the gate line 121 is elongated to extend. A plurality of sub-regions R1, R2 and R3 of the drain electrode 175a include a first sub-region R1, a second sub-region R2 and a third sub-region R3 in sequence in a direction away from the source electrode 173. A plurality of sub-regions R4, R5 and R6 of the dummy drain electrode 175b includes a fourth sub-region R4, a fifth sub-region R5, and a sixth sub-region R6 in sequence in a direction toward the source electrode 173.

As shown in the illustrated exemplary embodiment, at least one among the plurality of sub-regions R1, R2 and R3 of the drain electrode 175a includes an edge forming a first angle θ1 with the gate line 121, and at least one among the plurality of sub-regions R4, R5 and R6 of the dummy drain electrode 175b includes an edge forming a second angle θ2 with the gate line 121. The first angle θ1 and the second angle θ2 may range from about 0 degrees to about 90 degrees. A planar area of the plurality of sub-regions R1, R2 and/or R3 of the drain electrode 175a may become larger or smaller in a direction away from the source electrode 173. In the illustrated exemplary embodiment, the planar area of the plurality of sub-regions R1, R2 and R3 of the drain electrode 175a becomes larger in a direction away from the source electrode 173, but is not limited thereto. In an alternative exemplary embodiment of the TFT array panel 100 according to the invention, the planar area of the plurality of sub-regions R1, R2 and/or R3 of the drain electrode 175a may become smaller in a direction away from the source electrode 173, or the planar area of one or more of the plurality of sub-regions R1, R2 and R3 may be different from the other planar areas.

Also, the planar area of the plurality of sub-regions R4, R5 and/or R6 of the dummy drain electrode 175b may become larger or smaller in a direction toward the source electrode 173. In the illustrated exemplary embodiment, the planar area of the plurality of sub-regions R4, R5 and R6 of the dummy drain electrode 175b becomes smaller in a direction toward the source electrode 173, but is not limited thereto. In an alternative exemplary embodiment of the TFT array panel 100 according to the invention, the planar area of the plurality of sub-regions R4, R5, and R6 of the dummy drain electrode 175b may become larger in a direction toward the source electrode, and the planar area of one or more of the plurality of sub-region R4, R5 and R6 may be different from the other planar areas.

The total planar area of the first sub-region R1 of the drain electrode 175a may be substantially the same as the total planar area of the sixth sub-region R6 of the dummy drain electrode 175b. Also, the total planar area of the second sub-region R2 of the drain electrode 175a may be substantially the same as the total planar area of the fifth sub-region R5 of the dummy drain electrode 175b, and the total planar area of the third sub-region R3 of the drain electrode 175a may be the same as the total planar area of the fourth sub-region R4 of the dummy drain electrode 175b.

Figure 4:
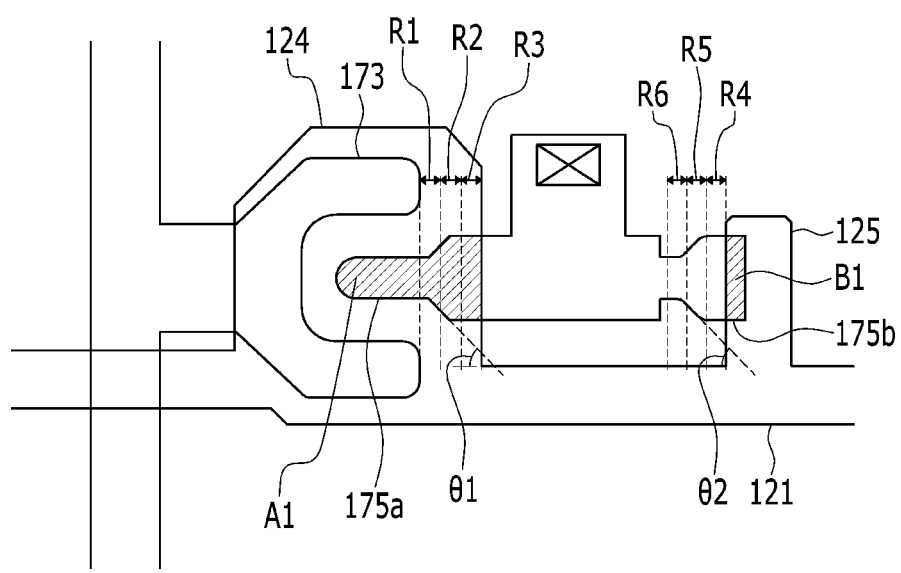
FIG. 4 and FIG. 5 are plan views to explain a misalignment of the thin film transistor array panel of FIG. 3.
Figure 5:
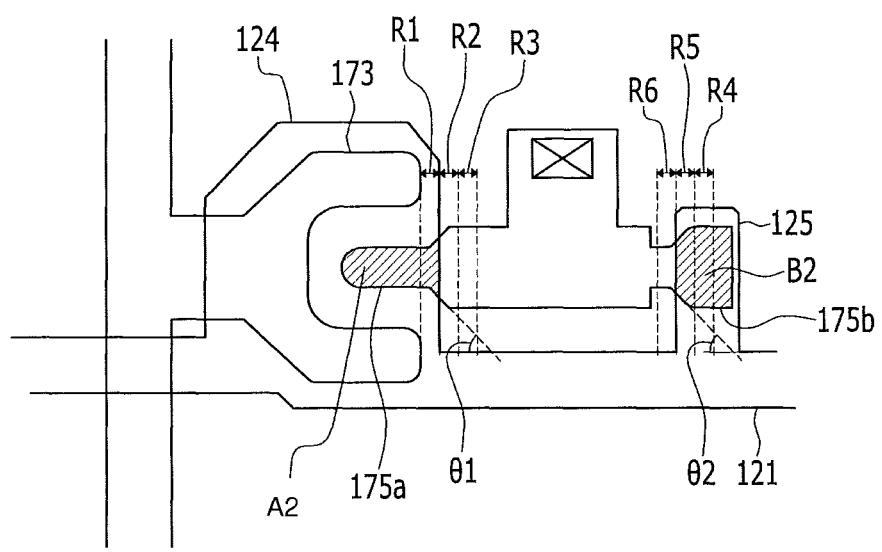

Next, a parasitic capacitance according to a misalignment of a TFT array panel 100 will be described with reference to FIG. 4 and FIG. 5 as well as FIG. 3. FIG. 4 and FIG. 5 are views to explain a misalignment of the TFT array panel of FIG. 3. FIG. 4 shows a gate wire including a gate electrode 124 and a dummy gate electrode 125 are shifted to the right side along a direction in which the gate line 121 extends, and FIG. 5 shows a gate wire including a gate electrode 124 and a dummy gate electrode 125 are shifted to the left side along a direction in which the gate line 121 extends.

In FIG. 3, the overlapping portion of the gate electrode 124 and the dummy gate electrode 125, and the drain electrode 175a and the dummy drain electrode 175b, is indicated by shading using oblique lines. In detail, the overlapping portion includes a first overlapping region A between the gate electrode 124 and the drain electrode 175a and a second overlapping region B between the dummy gate electrode 125 and the dummy drain electrode 175b. A width of the overlapping region is taken along the direction in which the gate line 121 extends.

Referring to FIG. 4, if the gate electrode 124 and the dummy gate electrode 125 are shifted to the right side, the planar area of the third overlapping region A1 between the gate electrode 124 and the dummy gate electrode 125 is larger than the planar area of the first overlapping region A of the gate electrode 124 and the dummy gate electrode 125 shown in FIG. 3. In detail, the overlapping region is increased by the area of the third sub-region R3 of the drain electrode 175a. Also, the planar area of the fourth overlapping region B1 between the dummy gate electrode 125 and the dummy drain electrode 175b is smaller than the planar area of the second overlapping region B between the dummy gate electrode 125 and the dummy drain electrode 175b shown in FIG. 3. In detail, the overlapping region is decreased by the area of the fourth sub-region R4 of the dummy drain electrode 175b.

However, as described above, the area of the third sub-region R3 of the drain electrode 175a is the same as the area of the fourth sub-region R4 of the dummy drain electrode 175b. Accordingly, in an example shown in FIG. 3, a sum of the first overlapping region A between the gate electrode 124 and the drain electrode 175a and the second overlapping region B between the dummy gate electrode 125 and the dummy drain electrode 175b is the same as a sum of the third overlapping region A1 between the gate electrode 124 and the drain electrode 175a and the fourth overlapping region B1 between the dummy gate electrode 125 and the dummy drain electrode 175b in an example shown in FIG. 4.

Referring to FIG. 5, if the gate electrode 124 and the dummy gate electrode 125 are shifted to the left side, the planar area of the fifth overlapping region A2 between the gate electrode 124 and the dummy gate electrode 125 is smaller than the planar area of the first overlapping region A of the gate electrode 124 and the dummy gate electrode 125 shown in FIG. 3. In detail, the overlapping region is decreased by the area of the second sub-region R2 of the drain electrode 175a. Also, the planar area of the sixth overlapping region B2 between the dummy gate electrode 125 and the dummy drain electrode 175b is greater than the area of the second overlapping region B between the dummy gate electrode 125 and the dummy drain electrode 175b shown in FIG. 3. In detail, the overlapping region is increased by the area of the fifth sub-region R5 of the dummy drain electrode 175b.

However, as described above, the area of the second sub-region R2 of the drain electrode 175a is the same as the area of the fifth sub-region R5 of the dummy drain electrode 175b. Accordingly, in an example shown in FIG. 3, a sum of the first overlapping region A between the gate electrode 124 and the drain electrode 175a and the second overlapping region B between the dummy gate electrode 125 and the dummy drain electrode 175b is the same as the sum of the fifth overlapping region A2 between the gate electrode 124 and the drain electrode 175a and the sixth overlapping region B2 between the dummy gate electrode 125 and the dummy drain electrode 175b in an example shown in FIG. 5.

As described above, an exemplary embodiment of the TFT array panel 100 according to the invention includes the gate electrode 124 and the dummy gate electrode 125, and the drain electrode 175a and the dummy drain electrode 175b, where the edge of the drain electrode 175a and the dummy drain electrode 175b has the portion forming the predetermined angle with the gate line 121, and the drain electrode 175a and the dummy drain electrode 175b include a plurality of sub-regions having a predetermined width in the direction that the gate line 121 extends, such that the area of each sub-region may one of increase or decrease in a direction away from the source electrode 173, and the corresponding areas of the sub-region of the drain electrode 175a and the sub-region of the dummy drain electrode 175b are the same.

Accordingly, although the drain electrode 175a has the shape of which the area is changed (e.g., one of increases and decreases) in the direction away from the source electrode 173, when the alignment error exists between the gate wire and the data wire, the planar area of the overlapping region between the gate electrode 124 and the dummy gate electrode 125, and the drain electrode 175a and the dummy drain electrode 175b, respectively, may be maintained to be substantially uniform. Therefore, the entire (e.g., total) overlapping area between the gate wire including the gate electrode 124 and the dummy gate electrode 125, and the data wire including the drain electrode 175a and the dummy drain electrode 175b is not changed such that the size of the parasitic capacitance according to the overlapping between the gate wire and the data wire is uniform.

Figure 6:
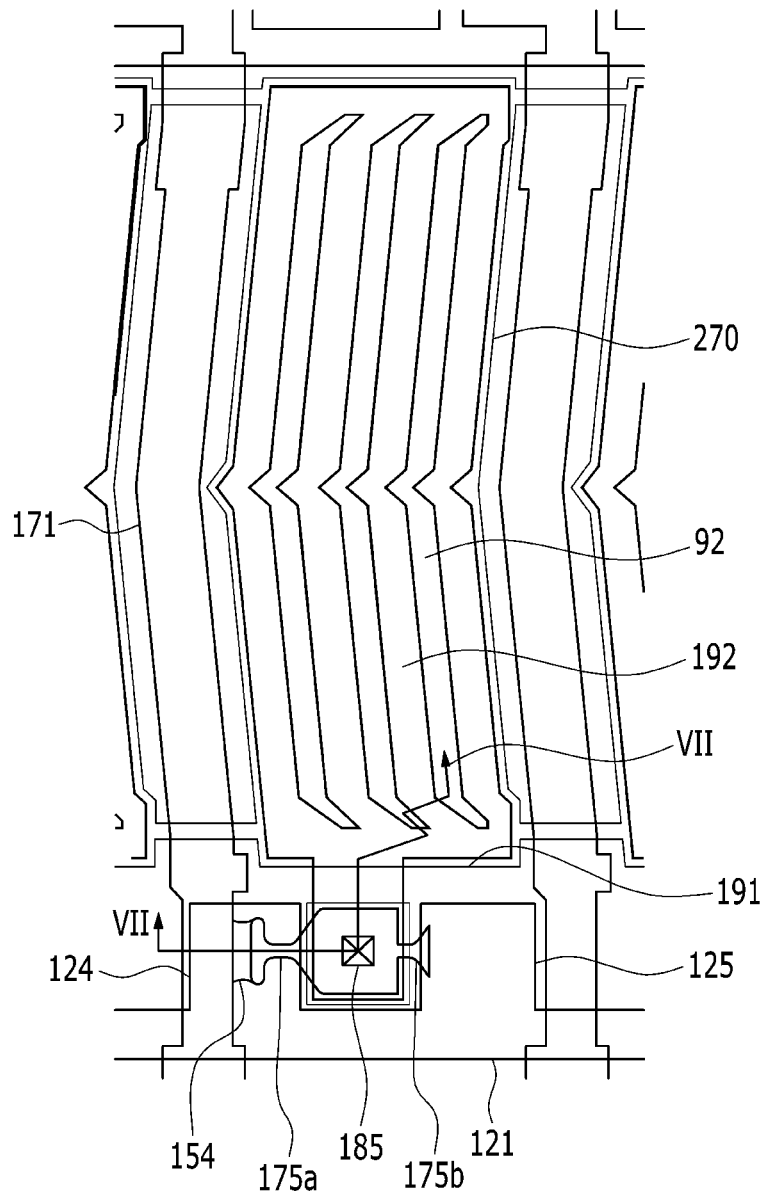
FIG. 6 is a plan view of another exemplary embodiment of a thin film transistor array panel according to the invention.
Figure 7:
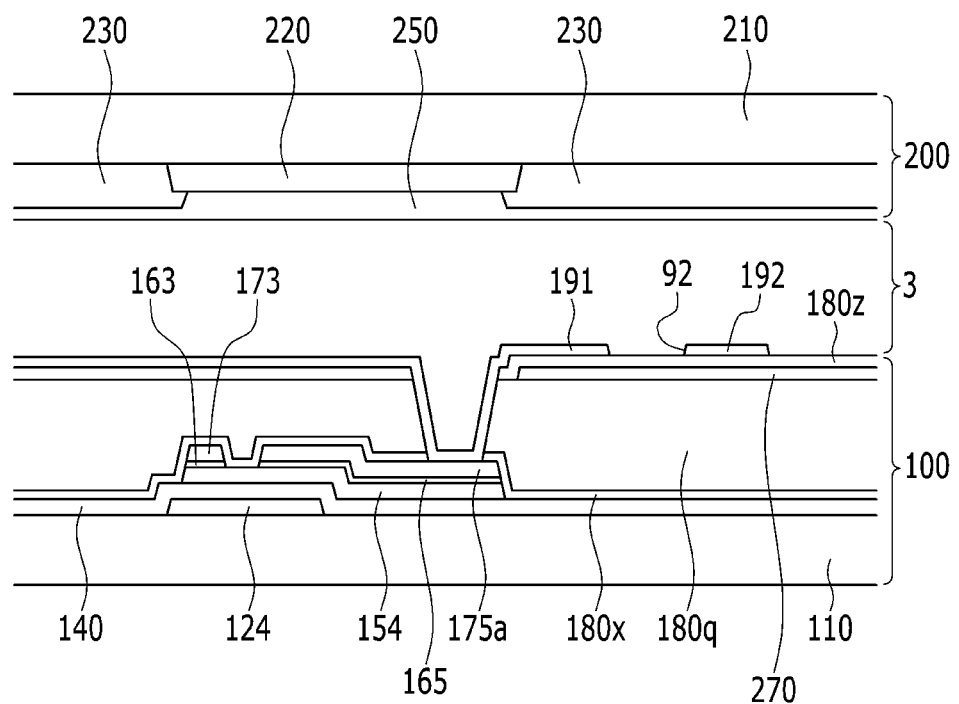
FIG. 7 is a cross-sectional view of the thin film transistor array panel of FIG. 6 taken along line VII-VII.
Figure 8:
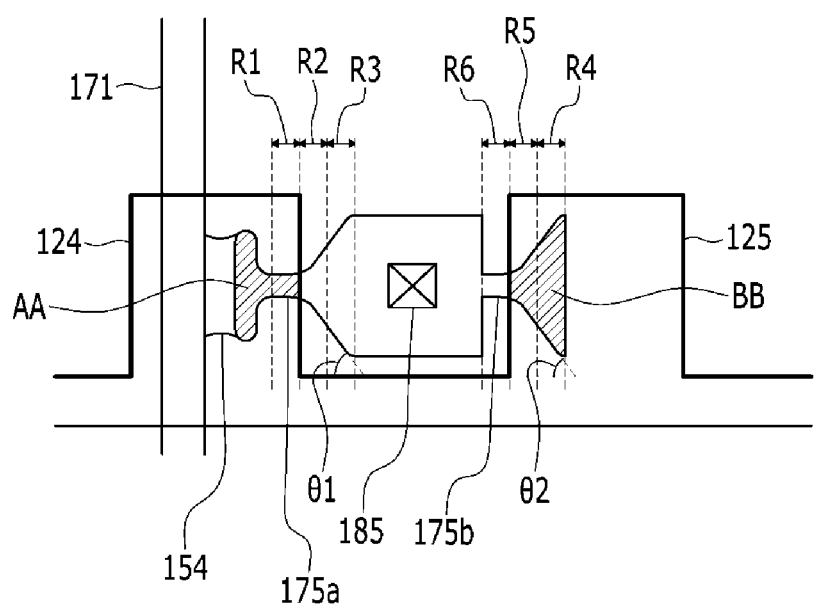
FIG. 8 is a plan view of an exemplary embodiment of an enlarged portion of the thin film transistor array panel of FIG. 6.

Next, another exemplary embodiment of a TFT array panel 100 according to the present will be described with reference to FIG. 6 to FIG. 8. FIG. 6 is a plan view of another exemplary embodiment of a TFT array panel according to the invention, FIG. 7 is a cross-sectional view of the TFT array panel of FIG. 6 taken along line VII-VII, and FIG. 8 is a plan view of an exemplary embodiment of an enlarged portion of the TFT array panel of FIG. 6.

One or more gate line 121 is disposed on a lower insulation substrate 110. Each gate line 121 includes a plurality of gate electrodes 124 and a plurality of dummy gate electrodes 125. Although it is not illustrated, a storage electrode line disposed on and/or in a same layer of the TFT array panel 100 as the gate line 121 may be further included.

A gate insulating layer 140 is disposed on the gate line 121.

One or more semiconductor 154 is disposed on the gate insulating layer 140. The semiconductor 154 may include hydrogenated amorphous silicon (simply referred to as a-Si), polysilicon, or an oxide semiconductor.

One or more ohmic contacts 163 and 165 is disposed on the semiconductor 154. The ohmic contacts 163 and 165 may include n+ hydrogenated a-Si heavily doped with an N-type impurity such as phosphorous, or may include a silicide. The ohmic contacts 163 and 165 form a pair of ohmic contacts on the semiconductor 154.

One or more data line 171, one or more drain electrode 175a, and one or more dummy drain electrode 175b is disposed on the ohmic contacts 163 and 165.

A vertical reference line y (reference line extending in a 'y' direction, not shown) forms an angle of 90° with an extension (e.g., transverse) direction ('x' direction) of the gate line 121. A portion of the data line 171 overlapping the gate electrode 124 is elongated to extend parallel to the reference line y. Between data line 171 portions which are parallel to the reference line y, the data line may include a plurality of inclined portions which meet each other in a middle region of the pixel region to form a 'V' shape in order, to obtain maximum transmittance of the liquid crystal display.

In the illustrated embodiment shown in FIG. 6, a first bent portion of the data line 171 may extend from an area of the gate electrode 124 at the bottom of the pixel region and towards the middle region of the pixel region, to be inclined so as to form an angle of about 7° with the vertical reference line y. A second bent portion of the data line 171 may extend from the middle region of the pixel region and towards an area of another gate electrode 124 at the top of the pixel region, to be inclined so as to form a predetermined angle with the first bent portion at the middle region of the pixel region. At the middle region of the pixel region, the second bent portion forms an angle of about 7° to about 15° with the first bent portion.

The source electrode 173 is a portion of the data line 171, and is disposed on the same virtual line as the data line 171. The drain electrode 175a is elongated so as to extend substantially in parallel to the source electrode 173. Accordingly, the drain electrode 175a is parallel to a portion of the data line 171.

The TFT array panel 100 may include the source electrode 173 positioned on the same virtual line as the data line 171 and the drain electrode 175a extending in parallel to the data line 171 to increase a width of the TFT while the area of the data wire is not increased, thus increasing an opening ratio of the liquid crystal display.

The drain electrode 175a is separated from the data line 171 and faces the source electrodes 173 with respect to the gate electrode 124.

The drain electrode 175a and the dummy drain electrode 175b are continuous with and connected to each other, where the dummy drain electrode 175b is positioned to be relatively close to the dummy gate electrode 125.

The ohmic contacts 163 and 165 exist only between the underlying semiconductor 154 and the overlying data lines 171, drain electrodes 175a and dummy drain electrode 175b to lower contact resistance between the underlying and overlying elements. However, when the semiconductor 154 includes an oxide semiconductor, the ohmic contacts 163 and 165 may be omitted.

A first passivation layer 180x is disposed on the data line 171, the drain electrode 175a, the dummy drain electrode 175b and the exposed portion of the semiconductor 154. The first passivation layer 180x may include an inorganic insulator or an organic insulator.

A second passivation layer 180q is disposed on the first passivation layer 180x. In an alternative exemplary embodiment, the second passivation layer 180q may be omitted. The second passivation layer 180q may be a color filter.

When the second passivation layer 180q is a color filter, the second passivation layer 180q may uniquely display one of primary colors, such as three primary colors of red, green and blue, or yellow, cyan and magenta, and the like. Although not shown in the drawings, the color filter may further include a color filter displaying a mixed color of the primary colors or white, in addition to the primary colors.

A common electrode 270 is disposed on the second passivation layer 180q. The common electrode 270 may have a substantially planar shape and be disposed on an entire surface of the lower insulation substrate 110 to have an overall plate shape. An opening (not shown) may be defined in a region corresponding to the planar circumference of the drain electrode 175a. That is, the common electrode 270 may have a flat plate shape.

Pixels or pixel areas are disposed in a display region of the liquid crystal display, and images are displayed in the display region. The liquid crystal display may also include a non-display region in which an image is not displayed. Common electrodes 270 disposed in adjacent pixels or pixel areas may be physical and/or electrically connected to each other to receive a common voltage having a predetermined size supplied from the outside of the display region.

A third passivation layer 180z is disposed on the common electrode 270. The third passivation layer 180z may include the organic insulating material or the inorganic insulating material.

A pixel electrode 191 is disposed on the third passivation layer 180z. The pixel electrode 191 includes a curved or inclined edge that is substantially parallel to the first bent portion and the second bent portion of the data line 171. A plurality of first cutouts 92 are defined in the pixel electrode 191. The pixel electrode 191 includes a plurality of first branch electrodes 192.

A contact hole 185 is defined to extend through thicknesses of the first passivation layer 180x, the second passivation layer 180q and the third passivation layer 180z, and exposes the drain electrode 175a. The pixel electrode 191 is physically and electrically connected to a wider expansion portion of the drain electrode 175a through the contact hole 185 thereby receiving the voltage from the drain electrode 175a.

Referring to the common electrode panel 200, a light blocking member 220 is disposed on an upper insulation substrate 210, and a plurality of color filters 230 are disposed thereon. When the second passivation layer 180q of the TFT array panel 100 is the color filter, the color filter 230 of the common electrode panel 200 may be omitted. In an alternative exemplary embodiment, the light blocking member 220 of the common electrode panel 200 may be disposed in the TFT array panel 100.

An overcoat 250 may be disposed on the color filter 230 and the light blocking member 220. In an alternative exemplary embodiment, the overcoat 250 may be omitted.

Next, referring to FIG. 8, the gate electrode 124, the dummy gate electrode 125, the drain electrode 175a and the dummy drain electrode 175b of the TFT array panel 100 according to the invention will be described.

Referring to FIG. 8, the drain electrode 175a and the dummy drain electrode 175b are continuous with and connected to each other to form a single, unitary, indivisible member, such as a drain member. The drain electrode 175a at a first end of the drain member faces the source electrode 173 with respect to the gate electrode 124. The dummy drain electrode 175b at an opposing second end of the drain member is positioned at a side opposite to the drain electrode 175a and is positioned to be close to the dummy gate electrode 125.

The drain electrode 175a includes a plurality of sub-regions R1, R2 and R3 having a predetermined width with reference to a direction in which the gate line 121 extends. The dummy drain electrode 175b also includes a plurality of sub-regions R4, R5 and R6 having a predetermined width with reference to the direction in which the gate line 121 extends. The plurality of sub-regions R1, R2 and R3 of the drain electrode 175a include the first sub-region R1, the second sub-region R2 and the third sub-region R3 in sequence in a direction away from the source electrode 173. The plurality of sub-regions R4, R5 and R6 of the dummy drain electrode 175b include the fourth sub-region R4, the fifth sub-region R5 and the sixth sub-region R6 in sequence in a direction toward the source electrode 173.

As shown, at least one among the plurality of sub-regions R1, R2 and R3 of the drain electrode 175a includes an edge forming the first angle θ1 with the gate line 121, and at least one among the plurality of sub-regions R4, R5 and R6 of the dummy drain electrode 175b includes an edge forming the second angle θ2 with the gate line 121. The first angle θ1 and the second angle θ2 may be from 0 degrees to 90 degrees.

A planar area of the plurality of sub-regions R1, R2 and R3 of the drain electrode 175a may become larger or smaller in a direction away from the source electrode 173. In the illustrated exemplary embodiment, the planar area of the plurality of sub-regions R1, R2 and R3 of the drain electrode 175a becomes larger towards the source electrode 173, but is not limited thereto. In an alternative exemplary embodiment, the planar area of the plurality of sub-regions R1, R2 and R3 of the drain electrode 175a may become smaller in a direction towards the source electrode 173, or the area of one of the plurality of sub-regions R1, R2 and R3 may be different from the other areas.

Also, the planar area of the plurality of sub-regions R4, R5 and R6 of the dummy drain electrode 175b may become larger or smaller in a direction towards the source electrode 173. In the illustrated exemplary embodiment, the planar area of the plurality of sub-regions R4, R5 and R6 of the dummy drain electrode 175b becomes smaller in a direction towards the source electrode 173, but is not limited thereto. In an alternative exemplary embodiment of the inventions, the planar area of the plurality of sub-regions R4, R5 and R6 of the dummy drain electrode 175b may become larger in a direction towards the source electrode 173, and the area of one of the plurality of sub-regions R4, R5 and R6 may be different from the other areas.

The total planar area of the first sub-region R1 of the drain electrode 175a may be the same as the total planar area of the sixth sub-region R6 of the dummy drain electrode 175b. Also, the total planar area of the second sub-region R2 of the drain electrode 175a may be the same as the total planar area of the fifth sub-region R5 of the dummy drain electrode 175b, and the total planar area of the third sub-region R3 of the drain electrode 175a may be the same as the total planar area of the fourth sub-region R4 of the dummy drain electrode 175b.

Figure 9:
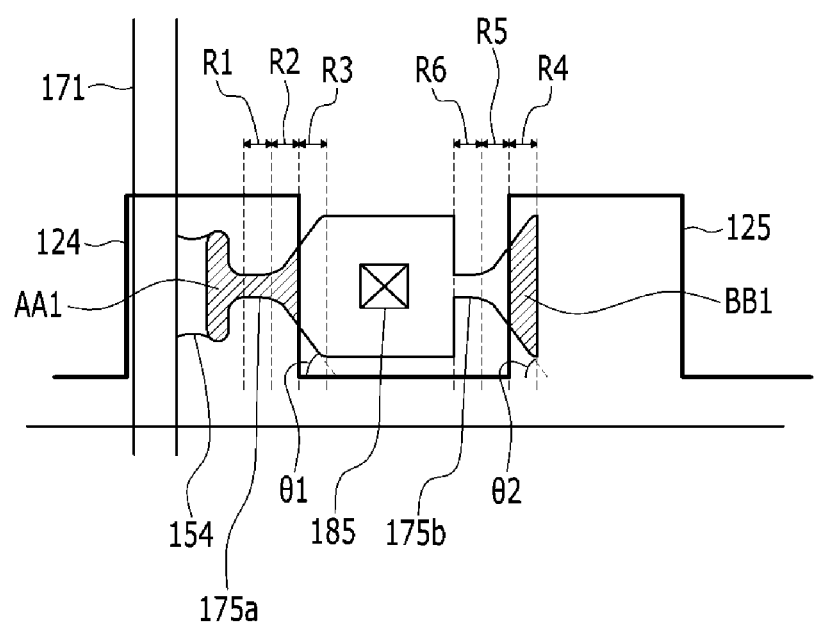
FIG. 9 and FIG. 10 are plan views to explain a misalignment of the thin film transistor array panel of FIG. 8.
Figure 10:
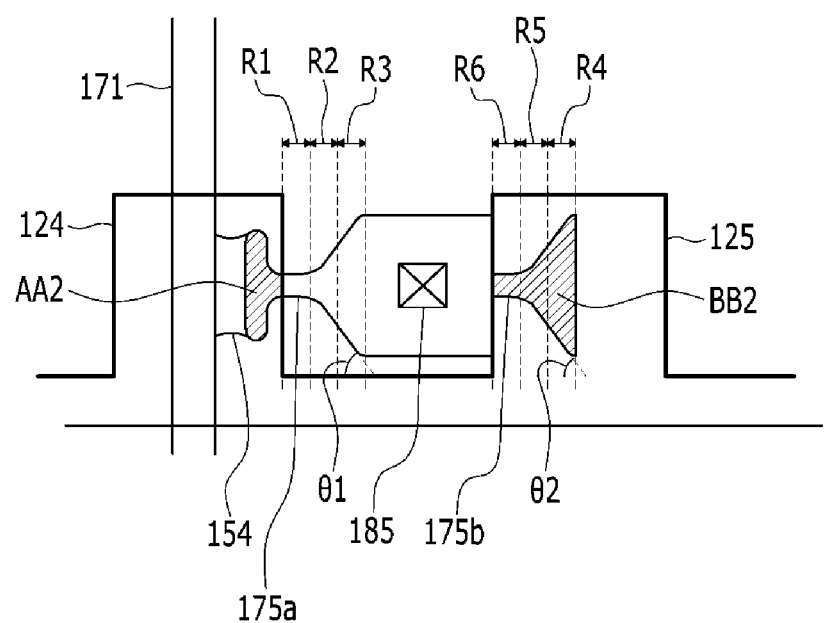

Next, parasitic capacitance according to a misalignment of a TFT array panel 100 will be described with reference to FIG. 9 and FIG. 10 as well as FIG. 8. FIG. 9 and FIG. 10 are views to explain a misalignment of the TFT array panel of FIG. 8. FIG. 9 shows a gate wire including a gate electrode 124 and a dummy gate electrode 125 are shifted to the right side along a direction in which the gate line 121 extends, and FIG. 10 shows a gate wire including a gate electrode 124 and a dummy gate electrode 125 are shifted to the left side along a direction in which the gate line 121 extends.

In FIG. 8, the overlapping portion of the gate electrode 124 and the dummy gate electrode 125, and the drain electrode 175a and the dummy drain electrode 175b, respectively, is indicated by shading using oblique lines. In detail, the overlapping portion includes the seventh overlapping region AA between the gate electrode 124 and the drain electrode 175a and the eighth overlapping region BB between the dummy gate electrode 125 and the dummy drain electrode 175b.

Referring to FIG. 9, if the gate electrode 124 and the dummy gate electrode 125 are shifted to the right side, the planar area of the ninth overlapping region AA1 between the gate electrode 124 and the dummy gate electrode 125 is larger than the planar area of the seventh overlapping region AA of the gate electrode 124 and the dummy gate electrode 125 shown in FIG. 8. In detail, the overlapping region is increased by the area of the second sub-region R2 of the drain electrode 175a. Also, the planar area of the tenth overlapping region BB1 between the dummy gate electrode 125 and the dummy drain electrode 175b is smaller than the planar area of the eighth overlapping region BB between the dummy gate electrode 125 and the dummy drain electrode 175b shown in FIG. 8. In detail, the overlapping area is decreased by the area of the fifth sub-region R5 of the dummy drain electrode 175b.

However, as described above, the area of the second sub-region R2 of the drain electrode 175a is the same as the area of the fifth sub-region R5 of the dummy drain electrode 175b. Accordingly, in an example shown in FIG. 8, a sum of the seventh overlapping region AA between the gate electrode 124 and the drain electrode 175a and the second overlapping region BB between the dummy gate electrode 125 and the dummy drain electrode 175b is the same as a sum of the ninth overlapping region AA1 between the gate electrode 124 and the drain electrode 175a and the tenth overlapping region BB1 between the dummy gate electrode 125 and the dummy drain electrode 175b in an example shown in FIG. 9.

Referring to FIG. 10, if the gate electrode 124 and the dummy gate electrode 125 are shifted to the left side, the planar area of the eleventh overlapping region AA2 between the gate electrode 124 and the dummy gate electrode 125 is smaller than the area of the seventh overlapping region AA of the gate electrode 124 and the dummy gate electrode 125 shown in FIG. 8. In detail, the overlapping region is decreased by the area of the first sub-region R1 of the drain electrode 175a. Also, the area of the twelfth overlapping region BB2 between the dummy gate electrode 125 and the dummy drain electrode 175b is larger than the area of the eight overlapping region BB between the dummy gate electrode 125 and the dummy drain electrode 175b shown in FIG. 8. In detail, the overlapping region is increased by the area of the sixth sub-region R6 of the dummy drain electrode 175b.

However, as described above, the area of the first sub-region R1 of the drain electrode 175a is the same as the area of the sixth sub-region R6 of the dummy drain electrode 175b. Accordingly, in an example shown in FIG. 8, a sum of the seventh overlapping region AA between the gate electrode 124 and the drain electrode 175a and the eighth overlapping region BB between the dummy gate electrode 125 and the dummy drain electrode 175b is the same as a sum of the eleventh overlapping region AA2 between the gate electrode 124 and the drain electrode 175a and the twelfth overlapping region BB2 between the dummy gate electrode 125 and the dummy drain electrode 175b in an example shown in FIG. 10.

As described above, an exemplary embodiment of the TFT array panel 100 according to the invention includes the gate electrode 124 and the dummy gate electrode 125, and the drain electrode 175a and the dummy drain electrode 175b, where the edge of the drain electrode 175a and the dummy drain electrode 175b has the portion forming the predetermined angle with the gate line 121, and the drain electrode 175a and the dummy drain electrode 175b include a plurality of sub-regions having a predetermined width in the direction that the gate line 121 extends, such that the area of each sub-region may one of increase or decrease in a direction away from the source electrode 173, and the corresponding areas of the sub-region of the drain electrode 175a and the sub-region of the dummy drain electrode 175b are the same.

Accordingly, although the drain electrode 175a has the shape of which the area is changed (e.g., one of increases and decreases) in the direction away from the source electrode 173, when the alignment error exists between the gate wire and the data wire, the planar area of the overlapping region between the gate electrode 124 and the dummy gate electrode 125, and the drain electrode 175a and the dummy drain electrode 175b, respectively, may be maintained to be substantially uniform. Therefore, the entire (e.g., total) overlapping area between the gate wire including the gate electrode 124 and the dummy gate electrode 125 and the data wire including the drain electrode 175a and the dummy drain electrode 175b is not changed such that the size of the parasitic capacitance according to the overlapping between the gate wire and the data wire is uniform.

Next, alternative exemplary embodiments a gate wire and a data wire of a TFT array panel according to the inventions will be described with reference to FIG. 11 to FIG. 17. FIG. 11 to FIG. 17 are plan views of an enlarged portion of a film transistor array panel according to the inventions. In detail, FIG. 11 to FIG. 17 show the gate electrode 124, the dummy gate electrode 125, the drain electrode 175a and the dummy drain electrode 175b of the TFT array panel 100 according to the invention.

Figure 11:
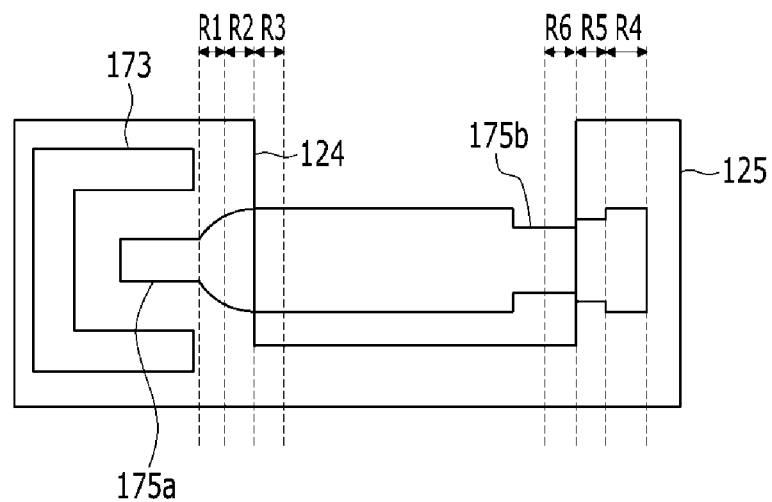
FIG. 11 to FIG. 17 are alternative exemplary embodiments of plan views of an enlarged portion of a thin film transistor array panel according to the invention.
Figure 12:
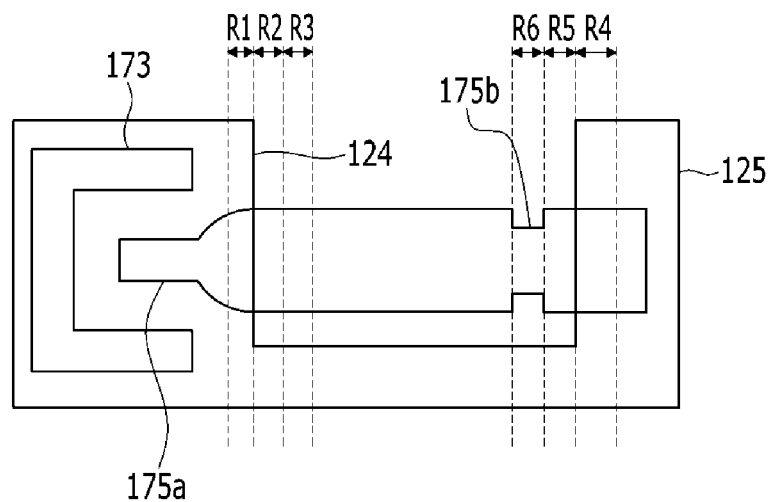

Firstly, referring to FIG. 11 and FIG. 12, an exemplary embodiment of the gate electrode 124, the dummy gate electrode 125, the drain electrode 175a and the dummy drain electrode 175b of the TFT array panel 100 according to the invention similar to those of the exemplary embodiment of the TFT array panel 100 described with reference to FIG. 1 to FIG. 3.

The drain electrode 175a faces the source electrode 173 with respect to the gate electrode 124, and overlaps the gate electrode 124. The dummy drain electrode 175b is positioned at a side of the drain member opposite to the drain electrode 175a and is positioned to be relatively close to the dummy gate electrode 125.

The drain electrode 175a includes a plurality of sub-regions R1, R2 and R3 having a predetermined width with reference to a direction in which the gate line 121 extends. The dummy drain electrode 175b also includes a plurality of sub-regions R4, R5 and R6 having a predetermined width with reference to the direction in which the gate line 121 extends.

At least one among the plurality of sub-regions R1, R2 and R3 of the drain electrode 175a includes an edge forming the first angle θ1 with the gate line 121.

The planar area of the plurality of sub-regions R1, R2 and R3 of the drain electrode 175a may become one or larger or smaller in a direction away from the source electrode 173. In the illustrated exemplary embodiment, the planar area of the plurality of sub-regions R1, R2 and R3 of the drain electrode 175a becomes larger in a direction away from the source electrode 173, but is not limited thereto. In another exemplary embodiment of the invention, the planar area of the plurality of sub-regions R1, R2 and R3 of the drain electrode 175a may be smaller in a direction away from the source electrode, or the area of one of the plurality of sub-regions R1, R2 and R3 may be different from the other areas.

Also, the planar area of the plurality of sub-regions R4, R5 and R6 of the dummy drain electrode 175b may become one of larger or smaller in a direction towards the source electrode 173. In the illustrated exemplary embodiment, the planar area of the plurality of sub-regions R4, R5 and R6 of the dummy drain electrode 175b becomes smaller in a direction towards the source electrode 173, but is not limited thereto. In another exemplary embodiment of the invention, the planar area of the plurality of sub-regions R4, R5 and R6 of the dummy drain electrode 175b may become larger in a direction towards the source electrode 173, and the area of one of the plurality of sub-region R4, R5, and R6 may be different from the other areas.

The total planar area of the first sub-region R1 of the drain electrode 175a may be the same as the total planar area of the sixth sub-region R6 of the dummy drain electrode 175b. Also, the total planar area of the second sub-region R2 of the drain electrode 175a may be the same as the total planar area of the fifth sub-region R5 of the dummy drain electrode 175b, and the total planar area of the third sub-region R3 of the drain electrode 175a may be the same as the total planar area of the fourth sub-region R4 of the dummy drain electrode 175b.

In the illustrated exemplary embodiments, the plane shape of the plurality of sub-regions R4, R5 and R6 of the dummy drain electrode 175b is different from that of the plurality of sub-regions R1, R2 and R3 of the drain electrode 175a. In detail, the edge of the plurality of sub-regions R1, R2 and R3 of the drain electrode 175a has a rounded shape, whereas the plurality of sub-regions R4, R5 and R6 of the dummy drain electrode 175b respectively have a rectangular or rectilinear shape. That is, the plurality of sub-regions R4, R5 and R6 include an edge parallel to the gate line 121.

Figure 13:
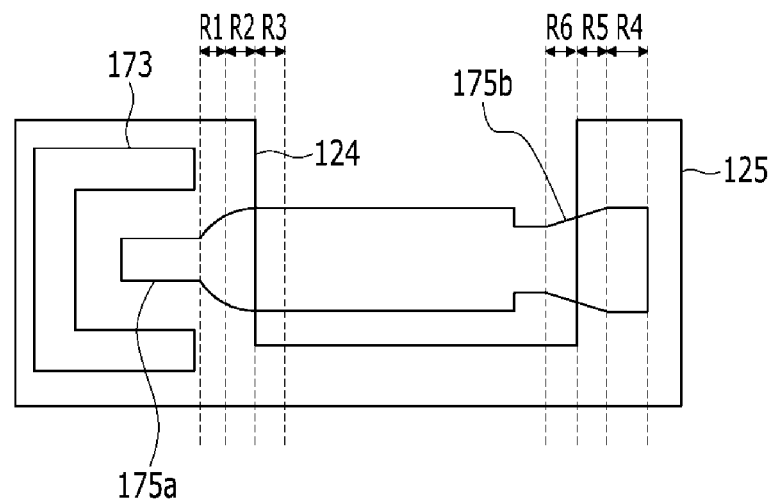
Figure 14:
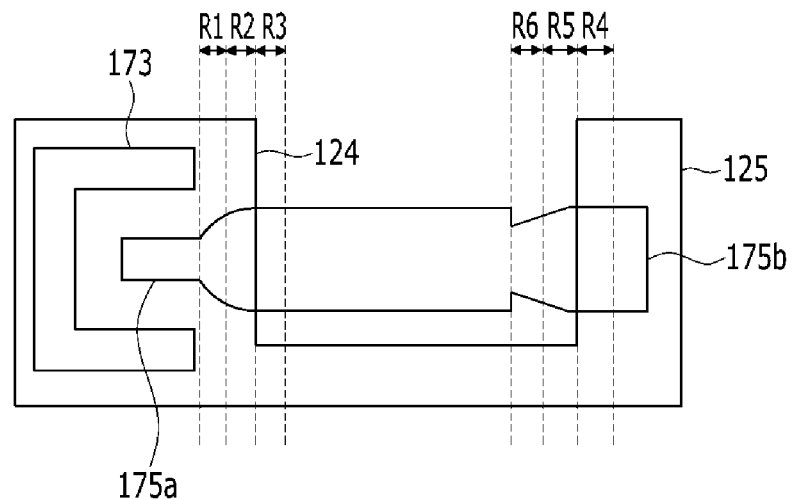
Figure 15:
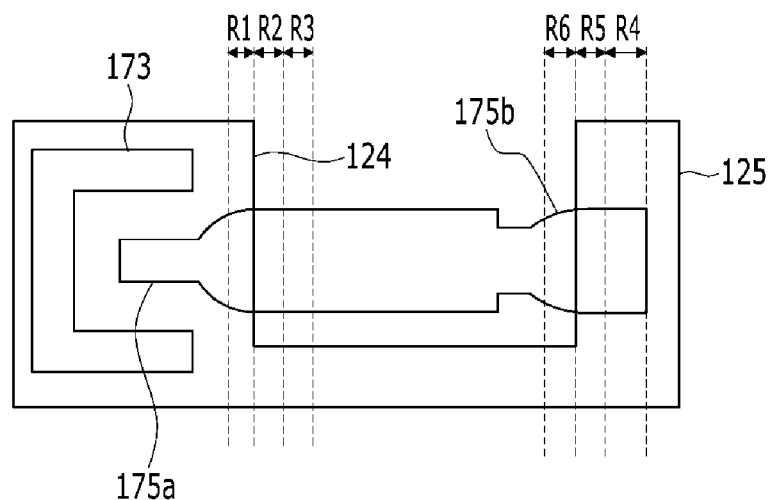

Next, referring to FIG. 13 to FIG. 15, an exemplary embodiment of the gate electrode 124, the dummy gate electrode 125, the drain electrode 175a and the dummy drain electrode 175b of the TFT array panel 100 according to the invention are similar to those of the TFT array panel 100 described with reference to FIG. 1 to FIG. 3.

The drain electrode 175a faces the source electrode 173 with respect to the gate electrode 124 and overlaps the gate electrode 124. The dummy drain electrode 175b is positioned at a side of the drain member opposite to the drain electrode 175a and is positioned to be relatively close to the dummy gate electrode 125.

The drain electrode 175a includes a plurality of sub-regions R1, R2 and R3 having a predetermined width with reference to a direction in which the gate line 121 extends. The dummy drain electrode 175b also includes a plurality of sub-regions R4, R5 and R6 having a predetermined width with reference to the direction in which the gate line 121 extends.

At least one among the plurality of sub-regions R1, R2 and R3 of the drain electrode 175a includes an edge forming a first angle θ1 with the gate line 121, and at least one of among the plurality of sub-regions R4, R5 and R6 of the dummy drain electrode 175b includes an edge forming a second angle θ2 with the gate line 121.

In the illustrated exemplary embodiments, the planar area of the plurality of sub-regions R1, R2 and R3 of the drain electrode 175a becomes larger in a direction away from the source electrode 173, but it is not limited thereto. In another exemplary embodiment of the TFT array panel 100 according to another exemplary embodiment of the invention, the planar area of the plurality of sub-regions R1, R2 and R3 of the drain electrode 175a may become smaller in a direction away from the source electrode 173, or the area of one of the plurality of sub-regions R1, R2 and R3 may be different from the other areas.

In the illustrated exemplary embodiments, the planar area of the plurality of sub-regions R4, R5 and R6 of the dummy drain electrode 175b becomes smaller in a direction towards the source electrode 173, but is not limited thereto. In another exemplary embodiment of the TFT array panel 100 according to the invention, the planar area of the plurality of sub-regions R4, R5 and R6 of the dummy drain electrode 175b may become larger in a direction towards the source electrode 173, and the area of one of the plurality of sub-regions R4, R5 and R6 may be different from the other areas.

The planar area of the first sub-region R1 of the drain electrode 175a may be the same as the total planar area of the sixth sub-region R6 of the dummy drain electrode 175b. Also, the total planar area of the second sub-region R2 of the drain electrode 175a may be the same as the total planar area of the fifth sub-region R5 of the dummy drain electrode 175b, and the total planar area of the third sub-region R3 of the drain electrode 175a may be the same as the total planar area of the fourth sub-region R4 of the dummy drain electrode 175b.

In the illustrated exemplary embodiments, the plane shape of the plurality of sub-regions R4, R5 and R6 of the dummy drain electrode 175b is different from that of the plurality of sub-regions R1, R2 and R3 of the drain electrode 175a. In detail, the edge of the plurality of sub-regions R1, R2 and R3 of the drain electrode 175a has a rounded shape, whereas the plurality of sub-regions R4, R5 and R6 of the dummy drain electrode 175b respectively have a trapezoid or rectangular shape. That is, the plurality of sub-regions R4, R5 and R6 include a cornered edge, and the portion thereof includes an edge parallel to the gate line 121.

Figure 16:
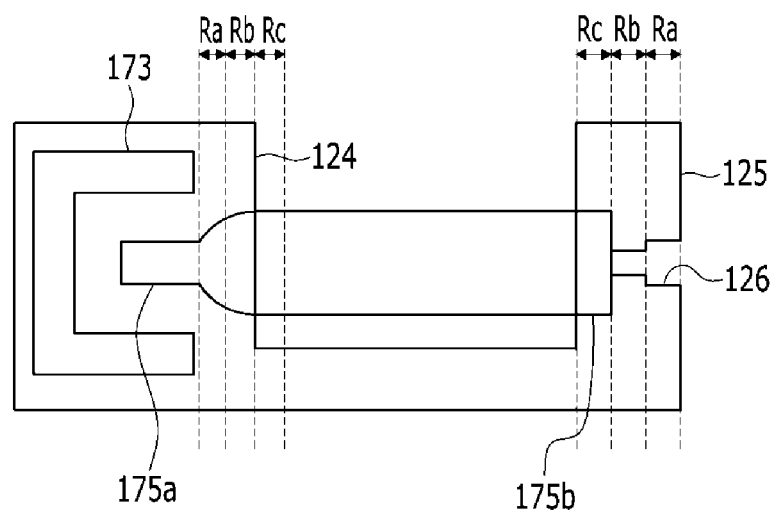

Referring to FIG. 16, the gate electrode 124, the dummy gate electrode 125, the drain electrode 175a, and the dummy drain electrode 175b of the TFT array panel 100 are different from those of the TFT array panel 100 of the previously described exemplary embodiments.

In detail, the plurality of sub-regions at the dummy gate electrode 125 end of the dummy drain electrode 175b have the same area, and the dummy gate electrode 125 includes a plurality of sub-regions Ra, Rb and Rc having different areas. The sub-regions Ra, Rb and Rc of the dummy gate electrode 125 have the different openings 126 or notches such that the sub-regions Ra, Rb and Rc have different areas. The planar area of the plurality of the sub-regions Ra, Rb and Rc may become one or larger or smaller in a direction towards the drain electrode 175a. However, in another exemplary embodiment of the TFT array panel 100 according to the invention, the dummy drain electrode 175b and the dummy gate electrode 125 may both include a plurality of sub-regions having different areas.

In the TFT array panel 100 according to the illustrated exemplary embodiment, the dummy drain electrode 175b has a predetermined shape, whereas the dummy gate electrode 125 overlapping the dummy drain electrode 175b includes the plurality of sub-regions Ra, Rb and Rc having the different areas. Although the gate wire including the gate electrode 124 and the dummy gate electrode 125 is moved to the right side or the left side in a direction in which the gate line 121 extends, the sum of the overlapping area between the drain electrode 175a and the gate electrode 124 and the overlapping area between the dummy drain electrode 175b and the dummy gate electrode 125 may be uniformly maintained. Therefore, the entire overlapping area between the gate wire including the gate electrode 124 and the dummy gate electrode 125 and the data wire including the drain electrode 175a and the dummy drain electrode 175b is not changed such that the size of the parasitic capacitance according to the overlapping between the gate wire and the data wire is uniform.

Figure 17:
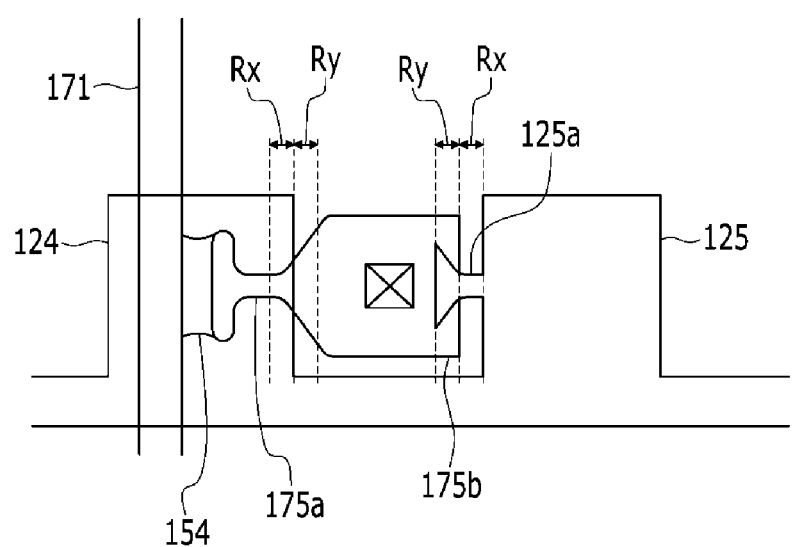

Referring to FIG. 17, another exemplary embodiment of the gate electrode 124, the dummy gate electrode 125, the drain electrode 175a and the dummy drain electrode 175b of the TFT array panel 100 according to the invention are similar to those of the TFT array panel 100 of the exemplary embodiment described with reference to FIG. 6 to FIG. 8.

The plurality of sub-regions of the dummy drain electrode 175b of the TFT array panel 100 have the same area, and the dummy gate electrode 125 includes a protrusion 125a including a plurality of sub-regions Rx and Ry having different areas. Only the protrusion 125a of the dummy gate electrode 125 overlaps the drain member. The planar area of the sub-regions Rx and Ry of the protrusion 125a may become one of larger or smaller closer to the drain electrode 175a, but is not limited thereto. In another exemplary embodiment of the TFT array panel 100 according to the invention, the protrusion 125a of the dummy drain electrode 175b and the dummy gate electrode 125 may both include a plurality of sub-regions having different areas.

In the TFT array panel 100 according to the illustrated exemplary embodiment, the dummy drain electrode 175b has a predetermined shape, however, the dummy gate electrode 125 overlapping the dummy drain electrode 175b includes the protrusion 125a including a plurality of sub-regions Rx and Ry having the different areas. Although the gate wire including the gate electrode 124 and the dummy gate electrode 125 is moved to the right side or the left side along a direction in which the gate line 121 extends, the sum of the overlapping area between the drain electrode 175a and the gate electrode 124 and the overlapping area between the dummy drain electrode 175b and the dummy gate electrode 125 may be uniformly maintained. Therefore, the entire overlapping area between the gate wire including the gate electrode 124 and the dummy gate electrode 125 and the data wire including the drain electrode 175a and the dummy drain electrode 175b is not changed such that the size of the parasitic capacitance according to the overlapping between the gate wire and the data wire is uniform.

The planar area change of the dummy gate electrode 125 is not limited to the exemplary embodiments shown in FIG. 16 or FIG. 17, and the area may be defined by various shapes of the dummy gate electrode 125.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
    a substrate;
    a gate line elongated in a first direction on the substrate, the gate line defining a first gate electrode and a second gate electrode which is spaced apart from the first gate electrode;
    a gate insulating layer on the first gate electrode and the second gate electrode;
    a semiconductor on the gate insulating layer; and
    a source electrode and a unitary drain electrode disposed on the semiconductor,
    wherein with reference to a predetermined width in the first direction and a length taken in a second direction perpendicular to the first direction, the unitary drain electrode defines:
        a first drain electrode which faces the source electrode with respect to the first gate electrode, the first drain electrode comprising a plurality of first regions thereof sequentially disposed in the first direction and each having a planar area defined by the predetermined width in the first direction and an entirety of the length of the first drain electrode at the predetermined width, and
        a second drain electrode which is adjacent to the second gate electrode, the second drain electrode comprising a plurality of second regions thereof sequentially disposed in the first direction and each having a planar area defined by the predetermined width in the first direction and an entirety of the length of the second drain electrode at the predetermined width,
    wherein among the plurality of first regions,
        a first region among the plurality of first regions comprises an edge which forms an angle from about 0 degrees to about 90 degrees with the first direction, and
        the planar area of at least one of the plurality of first regions is different from each planar area of remaining first regions of the plurality of first regions, and
    wherein the unitary drain electrode overlapped with the first and second gate electrodes defines,
        a first overlapping area by planar areas of the first gate electrode and the first drain electrode overlapping each other and including the first region which comprises the edge which forms the angle from about 0 degrees to about 90 degrees with the first direction, and
        a second overlapping area by planar areas of the second gate electrode and the second drain electrode overlapping each other,
    wherein the first and second drain electrodes are shaped to maintain a sum of the first and second overlapping areas.

2. The thin film transistor array panel of claim 1, wherein
    a second region among the plurality of second regions of the second drain electrode comprises an edge which forms an angle from about 0 degrees to about 90 degrees with the first direction, and
    the planar area of at least one of the plurality of second regions is different from each planar area of remaining second regions of the plurality of second regions.

3. The thin film transistor array panel of claim 2, wherein
the planar areas of the plurality of first regions and the planar areas of the plurality of second regions one of increase or decrease in the first direction away from the source electrode.

4. The thin film transistor array panel of claim 3, wherein
the plurality of first regions comprises a first sub-region, a second sub-region and a third sub-region in sequence in the first direction away from the source electrode,
the plurality of second regions comprises a fourth sub-region, a fifth sub-region and a sixth sub-region in sequence in the first direction towards the source electrode,
the planar area of the first sub-region is the same as the planar area of the sixth sub-region,
the planar area of the second sub-region is the same as the planar area of the fifth sub-region, and
the planar area of the third sub-region is the same as the planar area of the fourth sub-region.

5. The thin film transistor array panel of claim 4, further comprising:
a passivation layer on the source electrode, the first drain electrode and the second drain electrode; and
a pixel electrode on the passivation layer and connected to the first drain electrode through a contact hole defined in the passivation layer.

6. The thin film transistor array panel of claim 5, further comprising
a common electrode overlapping the pixel electrode; and
an insulating layer between the common electrode and the pixel electrode.

7. The thin film transistor array panel of claim 6, wherein
one of the pixel electrode and the common electrode comprises a plurality of branch electrodes, and the other of the pixel electrode and the common electrode is plate-shaped.

8. The thin film transistor array panel of claim 1, wherein
the planar areas of the plurality of first regions and the planar areas of the plurality of second regions one of increase or decrease in the first direction away from the source electrode.

9. The thin film transistor array panel of claim 8, wherein
the plurality of first regions comprises a first sub-region, a second sub-region and a third sub-region in sequence in the first direction away from the source electrode,
the plurality of second regions comprises a fourth sub-region, a fifth sub-region and a sixth sub-region in sequence in the first direction towards the source electrode,
the planar area of the first sub-region is the same as the planar area of the sixth sub-region,
the planar area of the second sub-region is the same as the planar area of the fifth sub-region, and
the planar area of the third sub-region is the same as the planar area of the fourth sub-region.

10. The thin film transistor array panel of claim 9, further comprising:
a passivation layer on the source electrode, the first drain electrode and the second drain electrode; and
a pixel electrode on the passivation layer and connected to the first drain electrode through a contact hole defined in the passivation layer.

11. The thin film transistor array panel of claim 10, further comprising
a common electrode overlapping the pixel electrode; and
an insulating layer between the common electrode and the pixel electrode.

12. The thin film transistor array panel of claim 11, wherein
one of the pixel electrode and the common electrode comprises a plurality of branch electrodes, and the other the pixel electrode and the common electrode is plate-shaped.

13. The thin film transistor array panel of claim 1, wherein
the plurality of first regions comprises a first sub-region, a second sub-region and a third sub-region in sequence in the first direction away from the source electrode,
the plurality of second regions comprises a fourth sub-region, a fifth sub-region and a sixth sub-region in sequence in the first direction towards the source electrode,
a planar area of the first sub-region is the same as a planar area of the sixth sub-region,
a planar area of the second sub-region is the same as a planar area of the fifth sub-region, and
a planar area of the third sub-region is the same as a planar area of the fourth sub-region.

14. The thin film transistor array panel of claim 13, further comprising:
a passivation layer on the source electrode, the first drain electrode and the second drain electrode; and
a pixel electrode on the passivation layer and connected to the first drain electrode through a contact hole defined in the passivation layer.

15. The thin film transistor array panel of claim 14, further comprising
a common electrode overlapping the pixel electrode; and
an insulating layer between the common electrode and the pixel electrode.

16. The thin film transistor array panel of claim 15, wherein
one of the pixel electrode and the common electrode comprises a plurality of branch electrodes, and the other the pixel electrode and the common electrode is plate-shaped.

17. A thin film transistor array panel comprising:
a substrate;
a gate line elongated in a first direction, and comprising a first gate electrode and a second gate electrode extended therefrom, on the substrate;
a gate insulating layer on the first gate electrode and the second gate electrode;
a semiconductor on the gate insulating layer; and
a source electrode, and a first drain electrode and a second drain electrode connected to each other, disposed on the semiconductor,
wherein with reference to a predetermined width in the first direction and a length taken in a second direction perpendicular to the first direction
the first drain electrode faces the source electrode with respect to the first gate electrode, and the second drain electrode is disposed adjacent to the second gate electrode,
the first drain electrode comprises a plurality of first regions thereof sequentially disposed in the first direction and each having a planar area defined by the predetermined width in the first direction and an entirety of the length of the first drain electrode at the predetermined width,
the second gate electrode comprises a plurality of third regions thereof sequentially disposed in the first direction and each having a planar width defined by the predetermined width in the first direction and an entirety of the length of the second gate electrode at the predetermined width, and the planar areas of the plurality of third regions increase or decrease in the first direction away from the source electrode.

18. The thin film transistor array panel of claim 17, wherein a first region of the plurality of first regions of the first drain electrode comprises an edge which forms an angle from about 0 degrees to about 90 degrees with the first direction, and the planar area of at least one of the plurality of first regions is different from each planar area of remaining first regions of the plurality of first regions.

19. The thin film transistor array panel of claim 18, wherein the planar areas of the plurality of first regions one of increase and decrease in the first direction away from the source electrode.

20. The thin film transistor array panel of claim 17, wherein the planar areas of the plurality of first regions one of increase and decrease in the first direction away from the source electrode.

* * * * *